United States Patent
Moon et al.

(10) Patent No.: US 7,492,437 B2
(45) Date of Patent: Feb. 17, 2009

(54) APPARATUS FOR INSPECTING ALIGNMENT FILM AND METHOD FOR FABRICATING LIQUID CRYSTAL DISPLAY DEVICE USING THE SAME

(75) Inventors: Seung Won Moon, Busan (KR); Byoung Chul Choi, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 489 days.

(21) Appl. No.: 11/315,628

(22) Filed: Dec. 23, 2005

(65) Prior Publication Data

US 2006/0286701 A1    Dec. 21, 2006

(30) Foreign Application Priority Data

Jun. 20, 2005  (KR) ...................... 10-2005-0053196

(51) Int. Cl.
*G02F 1/133*  (2006.01)
*G02F 1/1337*  (2006.01)

(52) U.S. Cl. ...................................... 349/187; 349/123

(58) Field of Classification Search ................. 349/187, 349/189, 190, 191, 192, 123; 430/320, 321; 445/24, 25; 438/30; 73/61.62, 104, 865.5, 73/865.8, 865.9, 866.3
See application file for complete search history.

(56) References Cited

U.S. PATENT DOCUMENTS 7,089,814 B2 *   8/2006   Chae et al. .................. 73/865.9
7,248,346 B2 *   7/2007   Ho et al. ....................... 356/36

* cited by examiner

*Primary Examiner*—Dung Nguyen
*Assistant Examiner*—Tai Duong
(74) *Attorney, Agent, or Firm*—McKenna Long & Aldridge LLP

(57) ABSTRACT

An apparatus for inspecting an alignment film and a method for fabricating a liquid crystal display device using the same are disclosed. By changing a spraying structure of a steam inspecting unit to check whether an alignment film is defective or not, a water splash phenomenon can be prevented and spraying can be performed uniformly on a large-scale glass. The apparatus for inspecting an alignment film comprises a first steam generating unit for generating first steam; a second steam generating unit for generating second steam by using the first steam as a heat source; and a steam spraying unit for spraying the second steam onto a substrate of a substrate to inspect an alignment film formed on the substrate.

8 Claims, 7 Drawing Sheets

APPARATUS FOR INSPECTING ALIGNMENT FILM AND METHOD FOR FABRICATING LIQUID CRYSTAL DISPLAY DEVICE USING THE SAME

This application claims the benefit of the Korean Patent Application No. P2005-53196, filed on Jun. 20, 2005, which is hereby incorporated by reference for all purposes as if fully set forth herein.

BACKGROUND OF THE INVENTION

1. Field of the Invention

The present invention relates to an apparatus for inspecting an alignment film and, more particularly, to an apparatus for inspecting an alignment film comprising a rubbing steam inspecting unit for performing inspecting on alignment films to check whether they are defective, and a method for fabricating a liquid crystal display (LCD) device using the same.

2. Description of the Related Art

Recently, as the demand for information displays has increased, especially for the use in portable (mobile) information devices, research and development of light thin flat panel displays (FPD), which can replace the CRT (Cathode Ray Tube), the existing display device, have increased.

Among FPDs, LCDs, devices for displaying images by using optical anisotropy of liquid crystal, exhibit excellent resolution and color and picture quality, so LCDs are widely used in notebook computers, desktop monitors or the like.

In general, the LCD device is a display device in which a data signal according to image information is separately supplied to liquid crystal cells arrange din a matrix form to control optical transmittance of the liquid crystal cells to thereby display a desired image.

The LCD device will now be described with reference to FIG. 1.

FIG. 1 is an exploded perspective view illustrating the structure of a related art LCD device.

As illustrated, the LCD device comprises a color filter substrate 5, a first substrate, an array substrate 10, a second substrate, and a liquid crystal layer 40 formed between the color filter substrate 5 and the array substrate 10.

The color filter substrate 5 comprises a color filter (C) comprised of red (R), green (G) and blue (B) sub-color filters 7, a black matrix 6 separating the sub-color filters (C) and blocking light transmitted through the liquid crystal layer 40, and a transparent common electrode 8 applying a voltage to the liquid crystal layer 40.

On the array substrate 10, there are formed gate lines 16 and data lines 17 arranged vertically and horizontally to define pixel regions (P). A thin film transistor (TFT), a switching device, is formed at the crossing of the gate line 16, and a pixel electrode 18 is formed at each pixel region (P).

The pixel region (P) is a sub-pixel corresponding to a single sub-color filter 7, and a color image is obtained by combining three types of red, green and blue colors. Namely, the three red, green and blue sub-pixels make one pixel, and the TFT (T) is connected to the red, green and blue sub-pixels.

An alignment film (not illustrated) for aligning liquid crystal molecules of the liquid crystal layer is formed on the color filter substrate 5 and the array substrate 10.

FIG. 2 illustrates a method for forming the alignment film using a roll printing method.

As illustrated, generally, an alignment film is formed by using a printing method using a plurality of rolls. Namely, an alignment solution 24 is supplied between a cylindrical anylox roll 22 and a doctor roll 23 and when the anylox roll 22 and the doctor roll 23 are rotated, the alignment solution 24 is uniformly coated entirely on the anylox roll 22. In this case, the alignment solution 24 is supplied by a dispenser 1 in an injector type.

The anylox roll 22 is rotated in contact with a printing roll 24 with a rubber plate 25 attached on a certain region of its surface, and the alignment solution 24 on the anylox roll 22 is transferred to the rubber plate 25. The rubber plate 25 corresponds to a substrate 26 on which the alignment solution 24 is to be coated, and has a master pattern to allow the alignment film to be selectively printed on the substrate.

As a printing table 27 with the substrate 26 loaded thereon is moved in contact with the printing roll 24, the alignment solution 24 which has been transferred to the rubber plate 25 is re-transferred onto the substrate 26 to thereby form an alignment film. Generally, the alignment film has the thickness of 500~1000 Å, and in this respect, even a thickness difference of about 100 Å can cause a defect such as a blot (spot) on a screen of the LCD device according to the non-uniformed alignment, so uniformly coating of the alignment film is a critical factor for determining characteristics of the screen.

Next, with the alignment film formed on the substrate, the alignment film is rubbed to arrange liquid crystals in a certain direction to form valleys in a certain direction.

FIG. 3 is a perspective view illustrating a related art rubbing process.

As illustrated, the alignment film 21 is rubbed to form the recesses 36 on the surface thereof. The rubbing process refers to rubbing the surface of the alignment film 21 in a certain direction by using a roller 30 with a rubbing cloth 35 wound thereon.

When the surface of the alignment film 21 is rubbed, it has fine recesses 36.

For the rubbing cloth 35, a soft cloth is used. The rubbing equipment including the roller 30 is relatively simple. The basic part for setting conditions for the rubbing process is setting a rubbing condition with a suitable strength and applying a uniform rubbing strength on a large area.

If the rubbing is not uniform, an alignment degree of liquid crystal molecules will not be spatially uniform, causing a defect that optical characteristics are different at a certain portion.

Checking for a defective alignment after rubbing is generally performed such that the rubbing state of the alignment 21 is checked with the naked eye by reflecting light on the surface of the substrate 26, or liquid crystal is dropped on the alignment film 21, the upper and lower substrates are allowed to overlap and a resulting color change or a light and shade difference is checked with the naked eye.

However, the method for checking the alignment film with the naked eye by using the light reflection is unreliable, and the method for using liquid crystal has a degraded process yield because a large amount of liquid crystal is consumed and the substrate used for the checking is to be discarded.

BRIEF DESCRIPTION OF THE INVENTION

Therefore, one advantage of the present invention is to provide an apparatus for inspecting an alignment film capable of enhancing reliability of inspecting uniformity of an alignment film and also enhancing a process yield without damaging a substrate, and a method for fabricating a liquid crystal display (LCD) device using the same.

Another advantage of the present invention is to provide an apparatus for inspecting an alignment film capable of being applicable to large-scale glass and preventing a water splash phenomenon according to steam spraying, and a method for fabricating a liquid crystal display (LCD) device.

To achieve these and other advantages and in accordance with the purpose of the present invention, as embodied and broadly described herein, there is provided an apparatus for inspecting an alignment film comprising: a first steam generating unit for generating first steam; a second steam generating unit for generating second steam by using the first steam as a heat source; and a steam spraying unit for spraying the second steam onto a substrate of a substrate to inspect an alignment film formed on the substrate.

To achieve the above features and advantages, there is also provided a method for fabricating a liquid crystal display (LCD) device comprising: performing an array process and a color filter process on a substrate; forming an alignment film on a surface of the substrate; inspecting the alignment film formed on the substrate by using an alignment film inspecting apparatus comprising a first steam generating unit for generating first steam, a second steam generating unit for generating second steam by using the first steam as a heat source and a steam spraying unit for spraying the second steam on the surface of the substrate; attaching two substrates which have been alignment film inspecting; and cutting the attached substrates into a plurality of unit liquid crystal display panels.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The apparatus for inspecting an alignment film and a method for fabricating a liquid crystal display (LCD) device using the same in accordance with preferred embodiments of the present invention will now be described with reference to the accompanying drawings.

Figure 1:
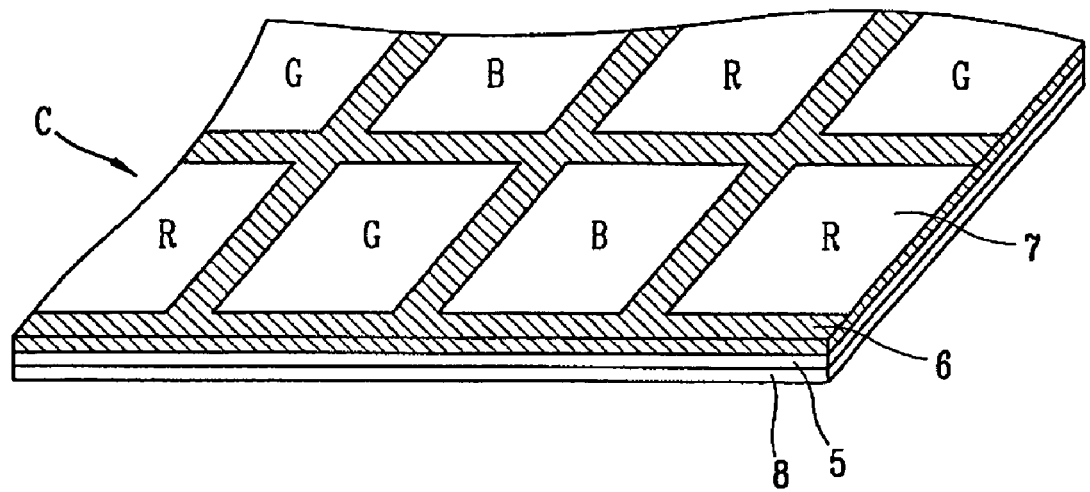
FIG. 1 illustrates the structure of a related art liquid crystal display (LCD) device.
Figure 1:
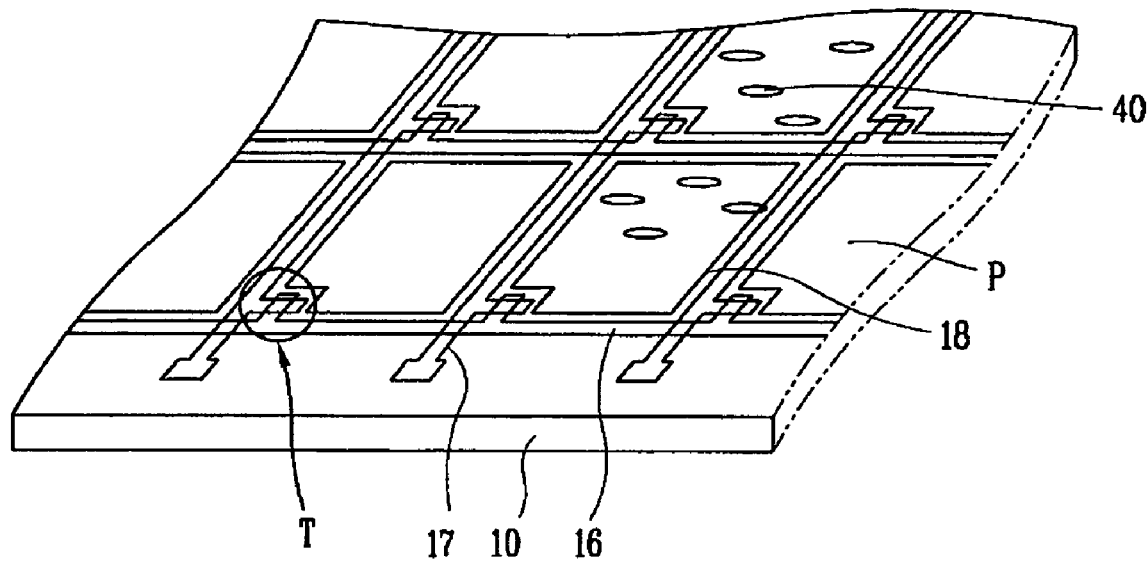
Figure 2:
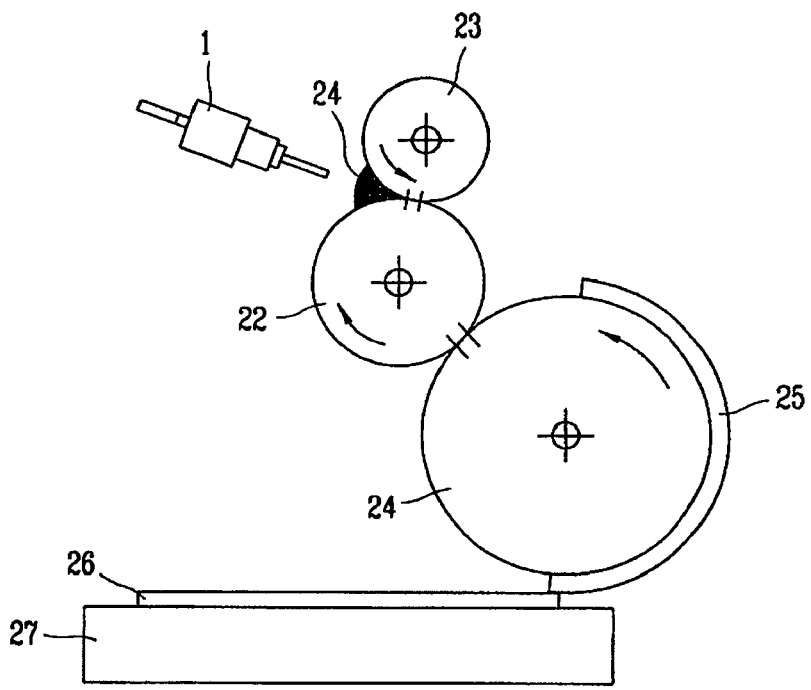
FIG. 2 illustrates a method for forming an alignment film by using a roll printing method.
Figure 3:
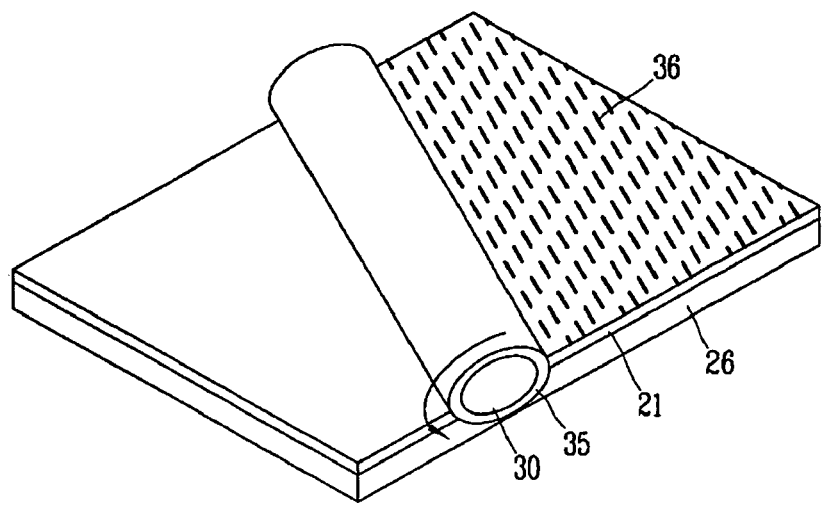
FIG. 3 is a perspective view illustrating a related art rubbing process.
Figure 4:
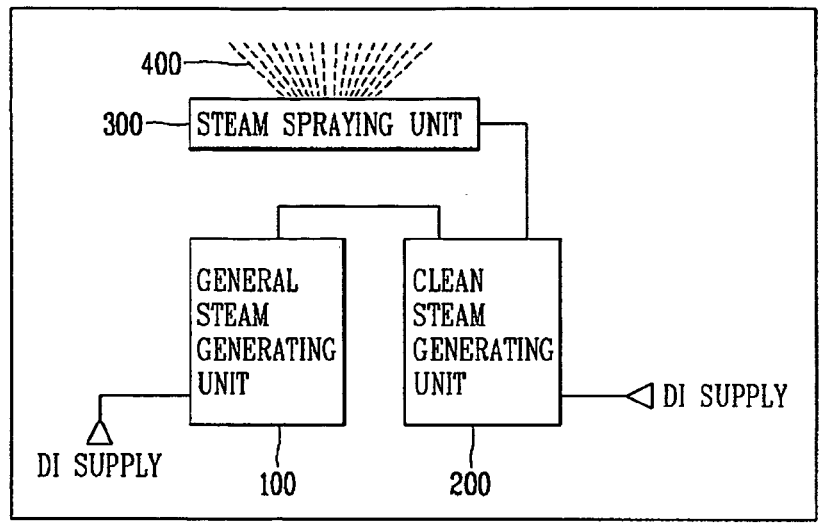
FIG. 4 is an exemplary view illustrating a concept of an apparatus for inspecting an alignment in accordance with the present invention.

FIG. 4 is an exemplary view illustrating a concept of an apparatus for inspecting an alignment in accordance with the present invention.

As illustrated, the apparatus for inspecting an alignment film comprises a general steam generating unit 100, a clean steam generating unit 200 and a steam spraying unit 300.

In order to inspect whether an alignment film is defective or not, a steam inspecting unit is used, which will now be described in detail.

The steam inspecting unit includes a steam generator therein. In the steam inspecting unit, a surface of the substrate on which the alignment film is formed is exposed to the steam generator to apply steam onto the surface of the substrate, and non-uniformity such as a color change, a light and shade difference or formed waterdrops are observed to thereby check uniformity of the alignment film. In this manner, the steam inspecting unit in this embodiment performs the inspecting, so the inspecting process is simple and the process yield can be improved because the substrate is not damaged.

The inspecting of the alignment by using the steam inspecting unit is performed in the following order.

First, the alignment-formed substrate is positioned on the steam generator. In this case, the substrate is installed to be slanted at a certain angle, e.g., at about 40°~50°, toward the steam generator to facilitate steaming up and its observation.

And the steam generator heats distilled water at a certain temperature, e.g., at about 80° C.~100° C. to generate steam to make the alignment film of the substrate steamed up.

In this manner, the steamed substrate is observed from the opposite side with the naked eye or by using observation equipment, for example, a camera unit or the like, to check non-uniformity such as a color change, a light and shade difference or formation of waterdrops, to thus check uniformity of the alignment film.

The general steam inspecting unit generates inspects the alignment film to check whether it is defective or not such that it generates steam by using a hot plate and sprays the generated steam at a short distance (about 20 cm away) to the substrate. In this case, which uses the hot plate spraying method. However, since spraying is performed at a short distance, it is made partially, so this method is not suitably applicable to large-scale glass.

In addition, the incomplete steam spraying according to the hot plate spraying method can cause water to splash onto the glass.

Thus, in order to solve this problem, in this embodiment of the present invention, an alignment film inspecting apparatus generates steam by using a boiling method and constitutes a steam inspecting unit comprising three functional parts of a general steam generating unit 100, a clean steam generating unit 200 and a steam spraying unit 300, to thereby prevent the water splash phenomenon and control the amount of sprayed steam. In addition, the alignment film inspecting apparatus can spray the generated steam at a far distance (about~50 cm) and perform spraying entirely by using the steam spraying unit 300, so it can be applicable to the large-scale glass.

In other words, in this embodiment of the present invention, in the alignment film inspecting apparatus, when steam is generated from the general steam generating unit 100 and the clean steam generating unit 200, the amount of steam is controlled through a decompression valve and sprayed onto the entire surface of the substrate at a far distance, so that the water splash phenomenon can be prevented and the spraying can be uniformly performed on the large-scale glass.

Major elements of the steam spraying unit using the boiling method in accordance with the present invention will now be described with reference to the accompanying drawing.

Figure 5:
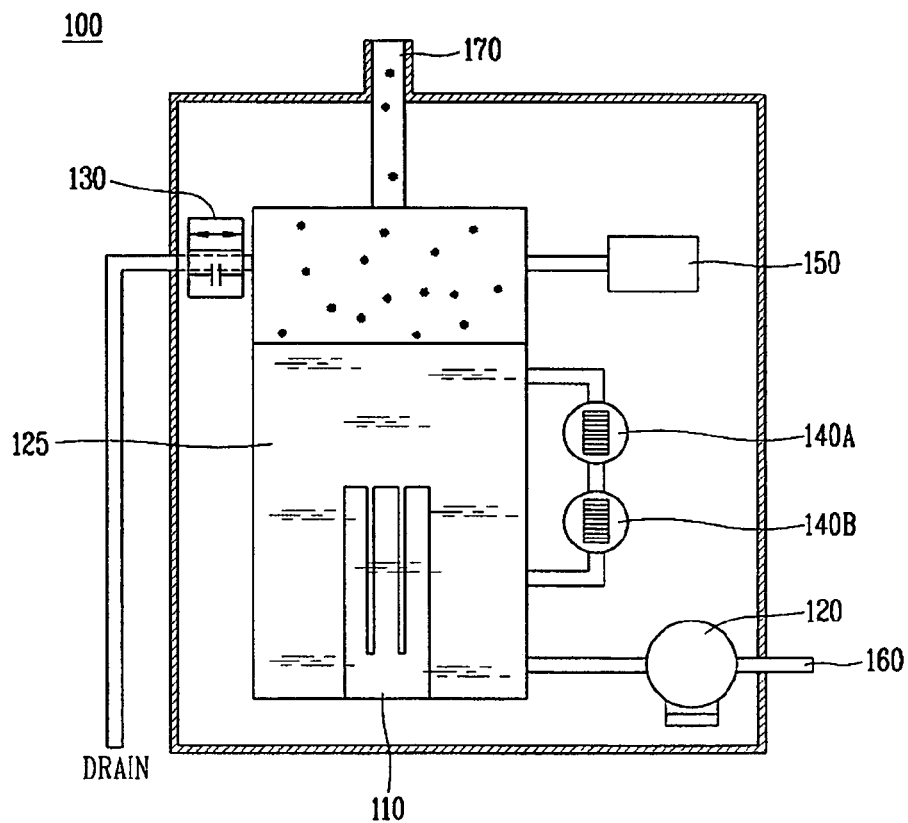
FIG. 5 is a schematic exemplary view illustrating the structure of a general steam generating unit of the alignment film inspecting apparatus in FIG. 4.

FIG. 5 is a schematic exemplary view illustrating the structure of a general steam generating unit of the alignment film inspecting apparatus in FIG. 4.

As illustrated in FIG. 5, the general steam generating unit 100 generates general steam (first steam) by using deionized (DI) water, and the first steam generated through the general steam generating unit 100 serves to perform secondary heat exchange in the clean steam generating unit 200.

For this purpose, the general steam generating unit 100 comprises a water supply pump 120, a heat exchange tank 125 and a heater 110.

The water supply pump 120 receives DI water through a DI water supply line 160 and supplies it to the interior of the heat exchange tank 125, and the DI water supplied into the heat exchange tank 125 is changed into steam of 100° C. or higher through the heater 110. In this case, the heater 110 heats the supplied water according to a direct heating method to change the DI water to first steam of 100° C. or higher.

In addition, the general steam generating unit 100 additionally includes water level sensors 140A and 140B, a pressure controller 150 and a safety valve 130.

The water level sensors 140A and 140B are installed at upper and lower portions of a water surface in the heat exchange tank 125 and serves to automatically add DI water into the heat exchange tank 125 through the DI water supply line 160.

The pressure controller 150 serves to control pressure inside the heat exchange tank 125, and in this case, generally, the pressure inside the tank 125 can be set up to 2~6 Kg/cm². When pressure inside the heat exchange tank 125 exceeds a pre-set value, the safety valve 130 is opened to automatically discharge the internal steam through a drain.

In this manner, the general steam generating unit 100 changes the DI water to the general steam (the first steam) according to the boiling method using the heater 110 and supplies it to the clean steam generating unit 200. The clean steam generating unit 200 will be described in detail as follows.

Figure 6:
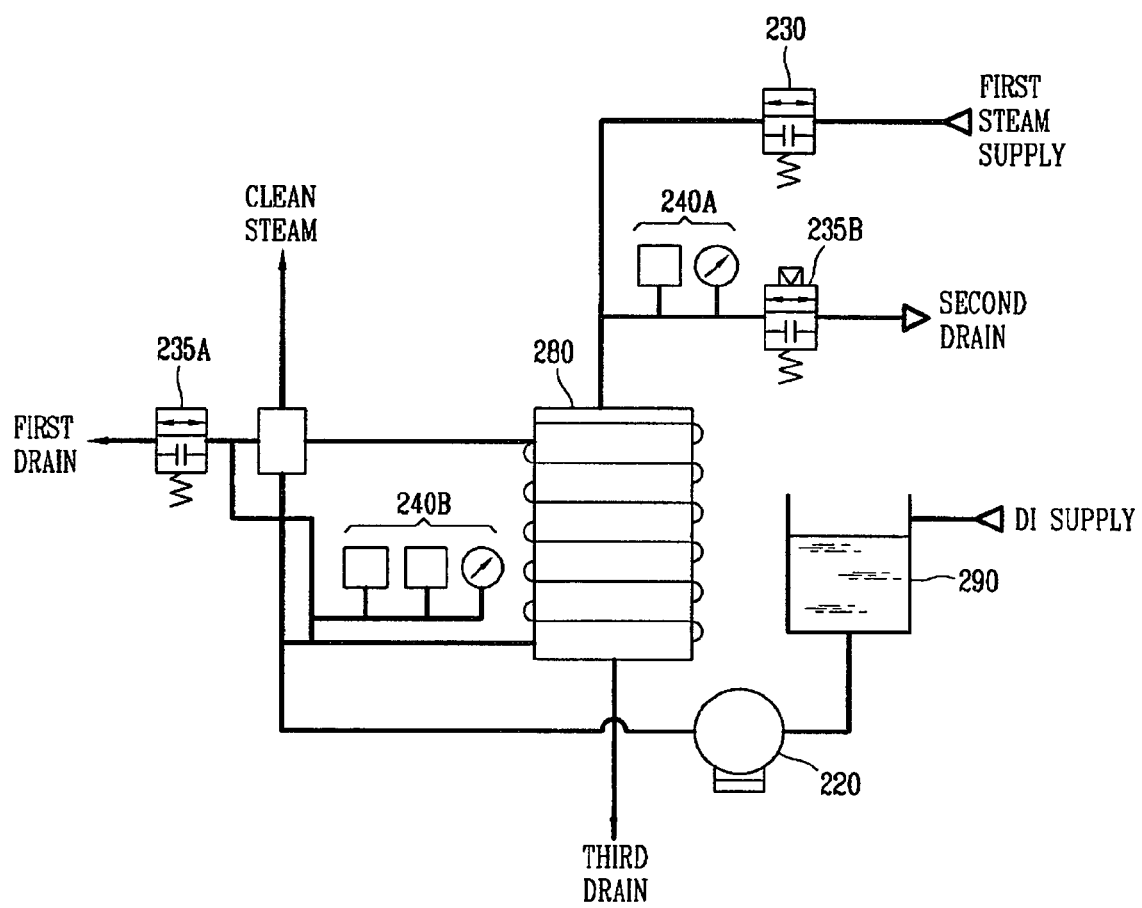
FIG. 6 is a schematic exemplary view illustrating the structure of a clean steam generating unit of the alignment film inspecting apparatus in FIG. 4.

FIG. 6 is a schematic exemplary view illustrating the structure of the clean steam generating unit of the alignment film inspecting apparatus in FIG. 4.

As illustrated in FIG. 6, the clean steam generating unit 200 generates clean steam (second steam) through a secondary heat exchange by using the first steam generated from the general steam generating unit 100, and comprises a heat exchanger 280, water supply tank 290 and a water supply pump 220.

The water supply pump 220 receives DI water stored in the water supply tank 290 and supplies it into the heat exchanger 280. Since the heat exchange 280 is formed as a dual-pipe line and heats the supplied DI water by using the first steam generated from the general steam generating unit 100 as a heat source to generate second steam, clean steam. In this embodiment of the present invention, the heat exchanger 280 is constructed as the dual-pipe line but the present invention is not limited thereto and the heat exchanger 280 can be constructed as a multi-pipe line of triple or more.

In this manner, the clean steam generating unit 200 can indirectly heat the DI water within the heat exchanger 280 by using the first steam generated from the general steam generating unit 100 as the heat source to thereby obtain clean steam.

The clean steam generating unit 200 additionally comprises a supply control valve 230, safety valves 235A and 235B, and pressure sensors 240A and 240B.

The supply control valve 230 controls the supply amount of the first steam and can set first and second pressure through the pressure sensors 240A and 240B. Herein, the second pressure refers to pressure of the DI water supplied through the water supply pump.

When the internal pressure of the heat exchanger 280 exceeds a pre-set value, the safely valves 235A and 235B are opened to automatically discharge the internal steam externally through first and second drains.

Though not illustrated, the water supply tank 290 comprises a water level sensor for automatically supplementing DI water.

Figure 7:
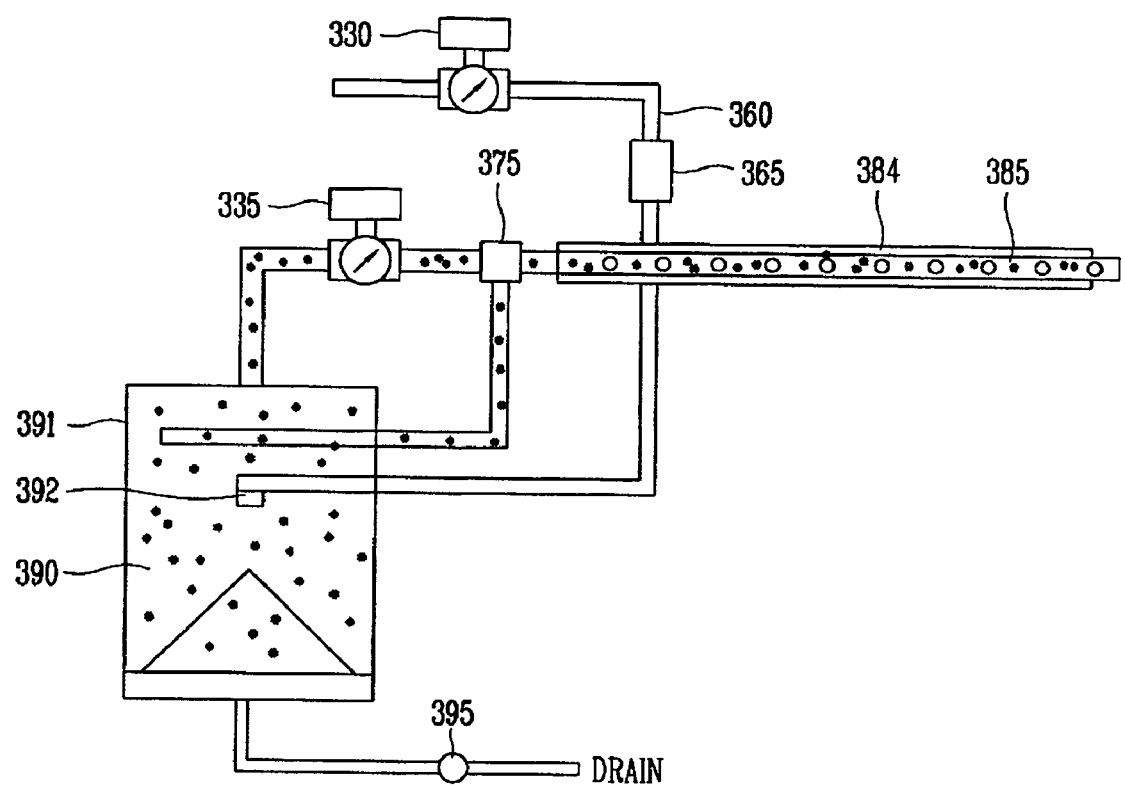
FIG. 7 is a schematic exemplary view illustrating the structure of a steam spraying unit of the alignment film inspecting apparatus in FIG. 4.

FIG. 7 is a schematic exemplary view illustrating the structure of a steam spraying unit of the alignment film inspecting apparatus in FIG. 4.

As illustrated in FIG. 7, the steam spraying unit 300 sprays the clean steam (the second steam) generated through the general steam generating unit and the clean steam generating unit to glass and comprises a steam/moisture separator 390 and a re-evaporation chamber 391.

The steam/moisture separator 390 is installed in the re-evaporation chamber 391 and separates moisture and steam contained in the second steam. Steam separated through the steam/moisture separator 390 is sprayed onto the glass through a spray pipe 385. In this case, a control valve 335 interposed between the steam/moisture separator 390 and the spray pipe 385 switches on/off introduction of steam into the spray pipe 385. In addition, a second separator 375 is also installed between the spray pipe 385 and the control valve 335.

The spray pipe 385 is formed as a dual-pipe line and steam is circulated through a manifold 384, a steam conservation unit, at an outer circumference of the spray pipe 385 to prevent condensing of steam. Herein, the manifold 384 refers to a collection pipe of steam or water.

In this embodiment, in the steam spraying unit 300, a precise decompression valve 330 is installed at the steam supply line 360 to control pressure of steam to thereby control the sprayed amount of steam.

For reference, reference numeral 365 denotes a strainer, a type of a valve, having a filter function, and 395 denotes a steam trap having a filter function with respect to steam discharged through the drain.

In this manner, the alignment film inspecting apparatus in accordance with the present invention is used to inspect the alignment film such that it generates clean steam according to the boiling method through the general steam generating unit and the clean steam generating unit, and sprays the generated clean steam to the surface of the alignment film through the steam spraying unit.

In addition, with the DI water stored in the tank, the alignment film inspection apparatus heats the DI water to generate and use steam, and when the DI water stored in the tank is reduced, the alignment film inspecting apparatus automatically supplies DI water, so that it can generate a large amount of DI water.

In addition, the general hot plate spraying method is disadvantages in that when it is applied to the large-scale glass by nozzle spraying, the number of tanks or the number of nozzles need to be increased, but the boiling method of the present invention can suitably cope with the large-scale glass by using a pipe nozzle for the steam spraying unit.

In addition, the alignment film inspecting apparatus in accordance with the present invention can increase the spraying pressure up to a level for allowing long distance steam spraying, and since it includes the steam/moisture separator, the water splash phenomenon can be prevented to the maximum.

The method for inspecting the alignment film by using the alignment film inspecting apparatus and a method for fabricating an LCD device will now be described in detail with reference to the accompanying drawings.

Figure 8:
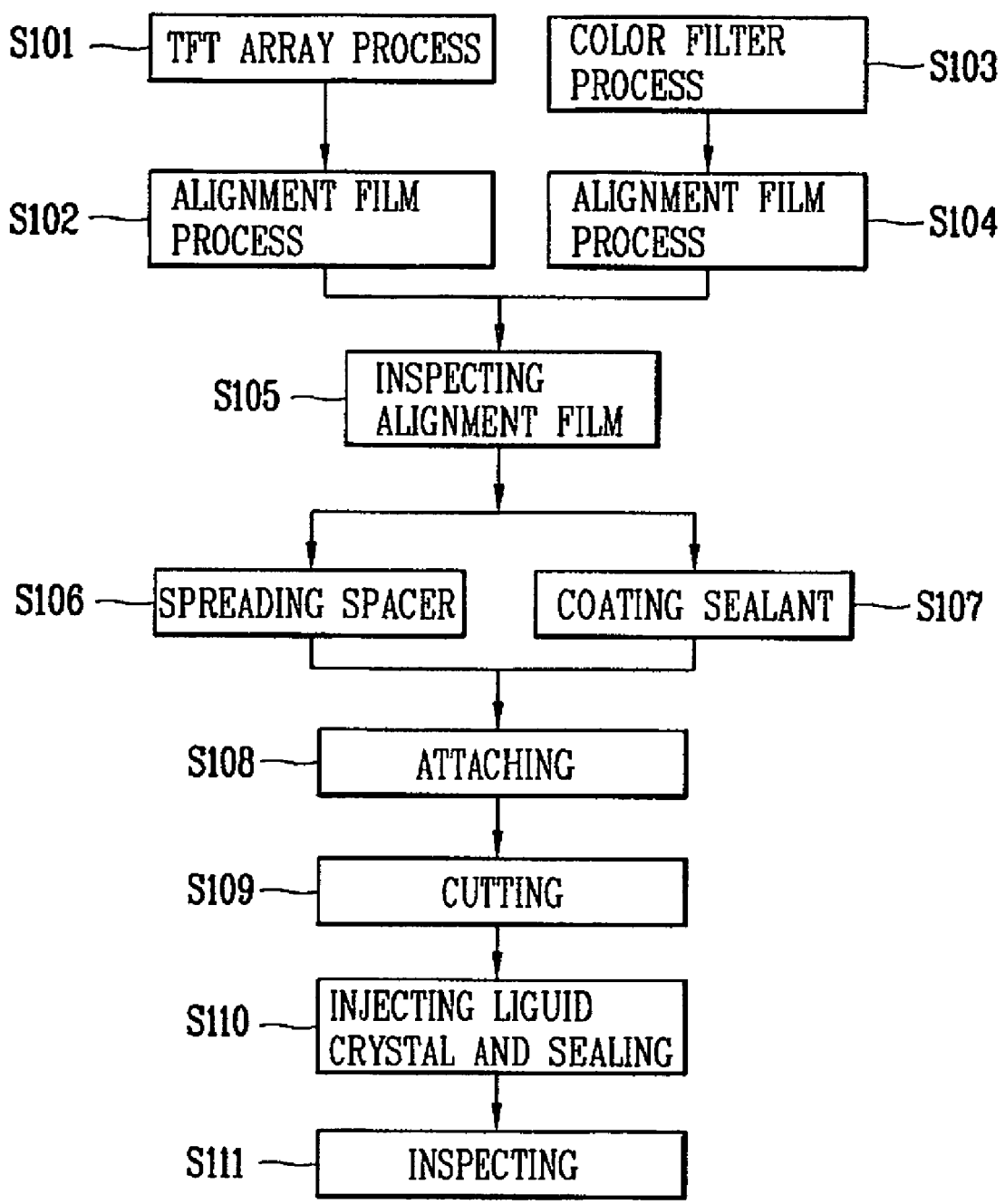
FIG. 8 is a flow chart illustrating a sequential process of a method for fabricating an LCD device in accordance with a first embodiment of the present invention.
Figure 9:
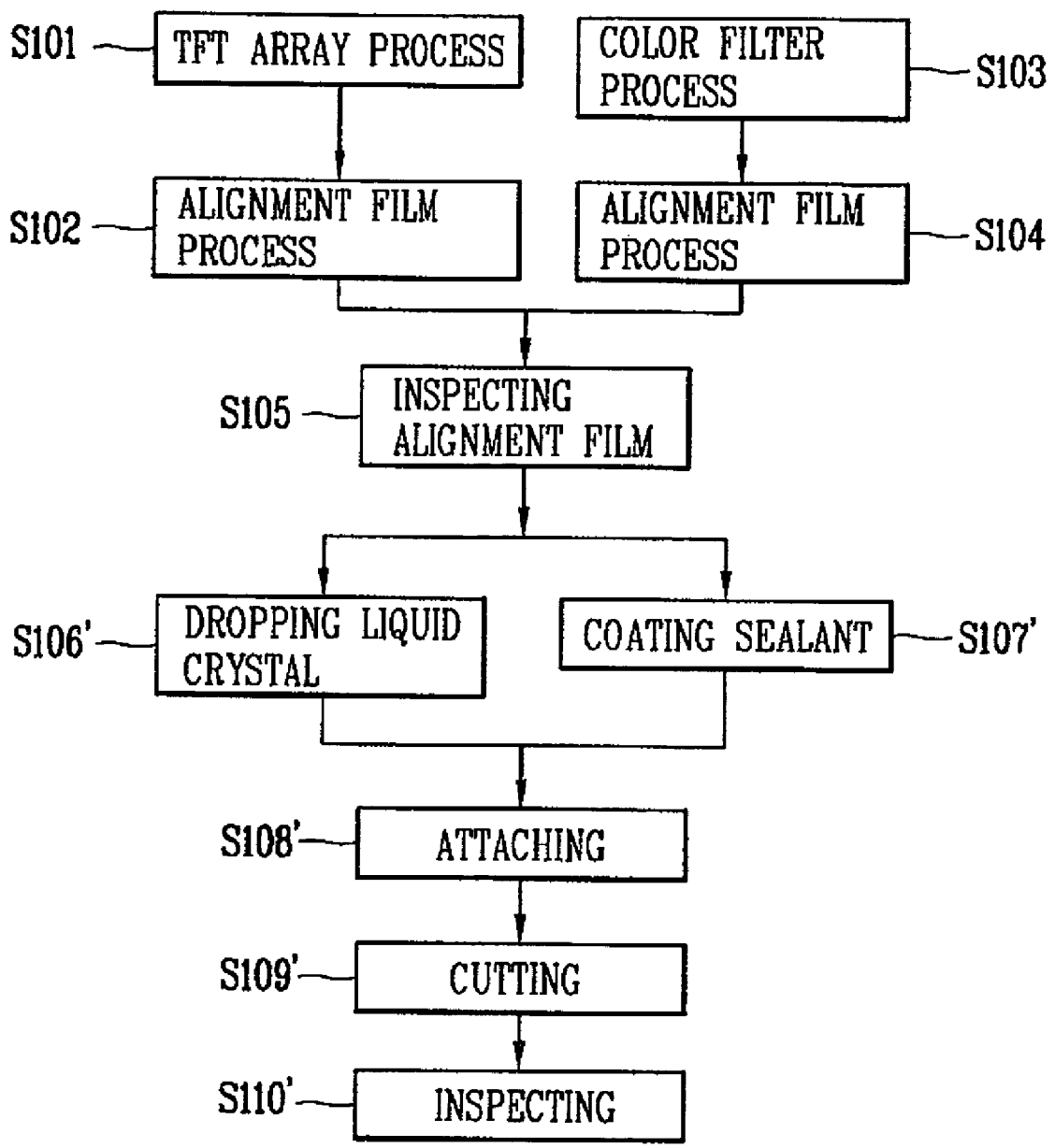
FIG. 9 is a flow chart illustrating a sequential process of a method for fabricating an LCD device in accordance with a second embodiment of the present invention.

FIG. 8 is a flow chart illustrating a sequential process of a method for fabricating an LCD device in accordance with a first embodiment of the present invention, and FIG. 9 is a flow chart illustrating a sequential process of a method for fabricating an LCD device in accordance with a second embodiment of the present invention.

The first embodiment of the present invention illustrates a method for fabricating an LCD device when a liquid crystal layer is formed by a liquid crystal injection method, while the second embodiment of the present invention illustrates a method for fabricating an LCD device when a liquid crystal layer is formed by a liquid crystal dropping method.

The process for fabricating the liquid crystal display panel can be divided into a driving device array process for forming a driving device on the lower array substrates, a color filter process for forming a color filter on the upper color filter substrate, and a cell process for attaching the array substrate and the color filter substrate.

To begin with, a plurality of gate lines and a plurality of data lines arranged vertically and horizontally to define pixel regions on the lower substrate are formed and a TFT, a driving device, is formed to be connected with the gate lines and the data lines at each of the pixel regions through the array process (step S101). In addition, a pixel electrode which is connected with the TFT and drives the liquid crystal layer as a signal is applied thereto through the TFT is formed through the array process.

A color filter layer comprising red, green and blue sub-color filters implementing color and a common electrode are formed on the upper substrate through the color filter process (step S103).

Subsequently, after an alignment film is coated on the upper and lower substrates, it is aligned to provide an anchoring force or a surface fixing force (namely, a pretilt angle and an alignment direction) to liquid crystal molecules of a liquid crystal layer formed between the upper and lower substrates (step S102 and S104). In this case, as the alignment processing method, a rubbing method or photo alignment method can be used.

The liquid crystal display panel uses electro-optic effects of liquid crystal, and since the electric optical effect is determined by anisotropy of the liquid crystal itself and a state of arrangement of liquid crystal molecules, controlling of the arrangement of liquid crystal molecules has much influence on stabilization of a display quality of the liquid crystal display panel.

Accordingly, the alignment film forming process and the rubbing process for effectively aligning liquid crystal molecules have an impact on the characteristics of picture quality in the liquid crystal cell process.

Accordingly, the rubbing process-finished upper and lower substrates are inspected by using the alignment film inspecting unit of the present invention as to whether the alignment film is defective or not (step S105).

In this case, the rubbing process refers to a process for arranging a fired alignment film in a certain direction so that liquid crystals can be arranged in a certain direction by a rubbing cloth.

When the surface of the alignment film is rubbed, the surface of the alignment film has fine recesses.

The rubbing cloth used for the rubbing process includes a soft cloth, and the basic part for setting conditions for the rubbing process is setting a rubbing condition with a suitable strength and applying a uniform rubbing strength on a large area.

The rubbing cloth is formed such that the weft and the warp thread cross finely, and the surface of the rubbing cloth can be damaged by a pattern formed on the substrate or debris while the surfaces of the plurality of substrates are being rubbed.

Thus, when the alignment film is not uniformly rubbed during the rubbing process by using the damaged rubbing cloth, an alignment degree of liquid crystal molecules is not uniformed spatially, resulting in a defective alignment film on which optical characteristics are different at a part.

The method for inspecting the defective rubbing includes a first inspecting for inspecting whether there exists a blot, a line pattern or a pin hole on the surface of the coated alignment film and a second inspecting for inspecting whether the surface of the rubbed alignment film has uniformity and a scratch or the like.

The first and second inspecting can be performed by using the alignment film inspecting apparatus in accordance with the present invention, and in this case, the alignment film inspecting apparatus inspects defective rubbing of the alignment film by spraying clean steam onto the surface of the alignment film.

In addition, as mentioned above, the alignment film inspecting apparatus of the present invention can be applied to inspection of the alignment film of the large-scale glass by spraying the clean steam generated by using the boiling method to a long distance in a full-scale (entirely), and because it includes the steam/moisture separator, the water splash phenomenon can be also prevented.

In case of using the vacuum injection method of the first embodiment of the present invention as illustrated in FIG. 8, spacers for uniformly maintaining a cell gap spread on the lower substrate and a sealant is coated on an outer edge of the upper substrate. And then, the lower and upper substrates are attached by applying a pressure thereto (steps S106~S108).

The lower and upper substrates are formed as large-scale glass. In other words, a plurality of panel regions are formed on the large-scale glass substrates, and the TFT, the driving device, and the color filter layer are formed at each panel region. Thus, in order to obtain a unit liquid crystal display panel, the glass substrates are to be cut and processed (step S109). Thereafter, liquid crystal is injected through a liquid crystal injection opening of each unit liquid crystal display panel, the liquid crystal injection opening is sealed to form a liquid crystal layer, and then, each unit liquid crystal display panel is inspected, thereby finishing fabrication of each of the unit liquid crystal display panels (steps S110 and S111).

The liquid crystal is injected by using a vacuum injection method using a pressure difference. That is, according to the vacuum injection method, the liquid crystal injection opening of the unit liquid crystal display panel separated from the large-scale mother substrates is put in a container filled with liquid crystal in a chamber with a certain degree of vacuum, and then, the degree of vacuum is changed to allow liquid crystal to be injected into the liquid crystal display panel according to a pressure difference between the interior and the exterior of the liquid crystal display panel. When the liquid crystal is filled inside the liquid crystal display panel, the liquid crystal injection opening is sealed to form the liquid crystal layer of the liquid crystal display panel. Thus, in order to form the liquid crystal layer at the liquid crystal display panel through the vacuum injection method, a portion of a seal pattern needs to be opened to serve as the liquid crystal injection opening.

However, the vacuum injection method has the following problem.

That is, first, it takes much time to fill the liquid crystal in the liquid crystal display panel. In general, since the attached liquid crystal display panel has an area of hundreds of cm$^2$ and a gap of merely about a few µm, the amount of injected liquid crystal per unit hour is inevitably small when the vacuum injection method using the pressure difference is employed. For example, about 8 hours are required for filling liquid crystal for fabricating an about 15-inch liquid crystal display panel. That is, since that much time is required for fabrication of the liquid crystal display panel, the productivity is degraded. In addition, as the liquid crystal display panel is increased in size, time taken for filling liquid crystal would be more lengthened and a defective filling of liquid crystal would also occur, resulting in that it cannot cope with the enlargement of the liquid crystal display panel.

Second, a large amount of liquid crystal is used. In general, the amount of liquid crystal actually injected into the liquid crystal display panel is quite small compared with the amount of liquid crystal filled in the container, and when liquid crystal is exposed in the air or exposed to a specific gas, it is reacted to the gas and degraded. Thus, although the liquid crystal filled in the container is filled in the plurality of unit liquid crystal display panels, a large amount of liquid crystal remaining after finishing the filling is discarded, and accordingly, the unit cost of the liquid crystal panel is increased only to weaken price competitiveness of the product.

In order to solve the problem of the vacuum injection method, recently, the dropping method is increasingly employed.

In case of the second embodiment using the dropping method, as illustrated in FIG. 9, after the alignment film is inspected (step S105), a certain seal pattern is formed with a sealant on the color filter substrate and, at the same time, a liquid crystal layer is formed on the array substrate (steps S106' and S107').

According to the dropping method, after liquid crystal is dropped and dispensed on the large-scale first mother substrate where a plurality of array substrates are disposed or on an image display region of the second mother substrate where the plurality of color filter substrates are disposed, the first and second mother substrates are attached by applying a certain pressure thereto to thereby make the liquid crystal uniformly distributed to the entire image display region and thus form a liquid crystal layer.

Thus, in the case where the liquid crystal layer is formed in the liquid crystal display panel through the dropping method, the seal pattern must be formed as a closed pattern surrounding the outer edge of the pixel part region in order to prevent a leakage of liquid crystal to outside of the image display region.

The dropping method allows dropping of liquid crystal within a relatively short time compared with the vacuum injection method and can quickly form the liquid crystal even when the liquid crystal display panel is large.

In addition, since the only required amount of liquid crystal is dropped on the substrate, such an increase in the unit cost of the liquid crystal display panel according to discarding of the high-priced liquid crystal as in the vacuum injection method can be prevented, and thus, the price competitiveness of the product can be enhanced.

Thereafter, in a state that the upper and lower substrates on which liquid crystal has been dropped and the sealant has been coated are aligned, a pressure is applied thereto to make the lower and upper substrate attached by the sealant and simultaneously the dropped liquid crystal spread uniformly on the entire portion of the panel (step S108').

Through the process, the plurality of liquid crystal display panels with the liquid crystal layer formed thereon is formed on the large-scale glass substrates (upper and lower substrates). The glass substrates are processed and cut to be separated into the plurality of liquid crystal display panels, which are then inspected to thereby finish fabrication of the liquid crystal display panel (steps S109' and S110').

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display (LCD) device comprising:
    performing an array process on a first substrate and a color filter process on a second substrate;
    forming an alignment film on a surface of the first and second substrates;
    inspecting the alignment film formed on the first and second substrates by using an alignment film inspecting apparatus comprising a first steam generating unit for generating first steam, a second steam generating unit for generating second steam by using the first steam as a heat source and a steam spraying unit for spraying the second steam on the surface of the first and second substrates,
    wherein the steam spraying unit comprises a steam/moisture separator for separating moisture contained in the second steam and a spray pipe for spraying the second steam from which moisture has been removed through the steam/moisture separator to glass;
    attaching the first and second substrates on which the inspecting the alignment film has been performed; and
    cutting the attached substrates into a plurality of unit liquid crystal display panels.

2. The method of claim 1, wherein the steam spraying unit sprays the second steam to a surface of the first and second substrates in the range of 10~100 cm between the steam spraying unit and the first and second substrates.

3. The method of claim 1, further comprising:
    forming a liquid crystal layer between the first and second substrates.

4. The method of claim 1, wherein the step of inspecting the alignment film comprises:
    a first inspecting process for checking whether there is a blot, a ling pattern or a pin hole on the surface of the alignment film after the alignment film is formed on the first and second substrates.

5. The method of claim 1, further comprising:
    performing rubbing on the first and second substrates on which the alignment film has been formed.

6. The method of claim 5, wherein the step of inspecting the alignment film comprises:
    a second inspecting process for checking uniformity of the surface of the rubbed alignment film and whether there is a scratch thereon after rubbing is performed on the alignment film-formed first and second substrates.

7. The method of claim 1, wherein the first steam generating unit comprises:

a water supply pump for supplying deionized (DI) water; and a heat exchange tank for changing the supplied DI to a first steam.

8. The method of claim 1, wherein the second steam generating unit comprises:

a water supply tank for storing DI water;

a water supply pump for supplying DI water stored in the water supply tank; and a heat exchanger for changing the supplied DI water to second steam by using the first steam as a heat source.

* * * * *